(12) United States Patent
Kuo et al.

(10) Patent No.: US 12,211,780 B2
(45) Date of Patent: Jan. 28, 2025

(54) ELECTRONIC PACKAGE STRUCTURE

(71) Applicant: Advanced Semiconductor Engineering, Inc., Kaohsiung (TW)

(72) Inventors: Chiung-Ying Kuo, Kaohsiung (TW); Hung-Chun Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 356 days.

(21) Appl. No.: 17/569,447

(22) Filed: Jan. 5, 2022

(65) Prior Publication Data

US 2023/0215790 A1     Jul. 6, 2023

(51) Int. Cl.
*H01L 23/498* (2006.01)
*G02B 6/12* (2006.01)
*H01L 23/31* (2006.01)

(52) U.S. Cl.
CPC .... *H01L 23/49822* (2013.01); *G02B 6/12004* (2013.01); *H01L 23/3121* (2013.01); *H01L 23/49811* (2013.01)

(58) Field of Classification Search
None
See application file for complete search history.

(56) References Cited

U.S. PATENT DOCUMENTS

| | | | |
|---|---|---|---|
| 7,005,719 B2 | 2/2006 | Masumoto | |
| 7,923,273 B2* | 4/2011 | Dutta | G02B 6/428 438/92 |
| 10,254,476 B1* | 4/2019 | Dutta | G02B 6/428 |
| 10,416,378 B2* | 9/2019 | Zhang | G02B 6/43 |
| 2018/0372952 A1* | 12/2018 | Zhang | G02B 6/12004 |

* cited by examiner

*Primary Examiner* — Long Pham
(74) *Attorney, Agent, or Firm* — FOLEY & LARDNER LLP

(57) ABSTRACT

An electronic package structure is provided. The electronic package structure includes a first carrier, a first electronic component, a first optical channel, and a second electronic component. The first electronic component is disposed on or within the first carrier. The first optical channel is disposed within the first carrier. The first optical channel is configured to provide optical communication between the first electronic component and the second electronic component. The first carrier is configured to electrically connect the first electronic component.

13 Claims, 20 Drawing Sheets

ELECTRONIC PACKAGE STRUCTURE

BACKGROUND

1. Field of the Disclosure

The present disclosure relates to an electronic package structure, and in particular to an electronic package structure with electronic components optically coupled with each other.

2. Description of the Related Art

The trend toward increasingly high level integration within integrated circuits (IC) leads to higher data rates and greater density of IC per unit area. With the increase of the amount of data and the signal speed, signal loss may increase. In conventional package devices, conductive traces, such as copper traces, are utilized to transmit signals from one electronic component to another. However, such copper traces may lead to relatively large signal loss, which may have a negative impact on data communication, especially when applied to high speed r high frequency devices. Therefore, a new package device is required to improve these problems.

SUMMARY

In some embodiments, an electronic package structure includes a first carrier, a first electronic component, a first optical channel, and a second electronic component. The first electronic component is disposed on or within the first carrier. The first optical channel is disposed within the first carrier. The first optical channel is configured to provide optical communication between the first electronic component and the second electronic component. The first carrier is configured to electrically connect the first electronic component.

In some embodiments, an electronic package structure includes a carrier and an electronic component. The carrier includes a redistribution structure and an optical interconnect structure embedded in the redistribution structure. The electronic component is disposed on or within the carrier. The electronic component is optically coupled with the optical interconnect structure to transmit optical signals from or to the electronic component.

In some embodiments, an electronic package structure includes a carrier and an optical channel. The optical channel is disposed within the carrier. The optical channel is configured to provide optical communication between a first surface of the carrier and a second surface of the carrier. The optical channel includes a first segment and a second segment non-parallel with the first segment. The optical channel includes a homogenous portion extending from the first segment to the second segment.

BRIEF DESCRIPTION OF THE DRAWINGS

Aspects of some embodiments of the present disclosure may be readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
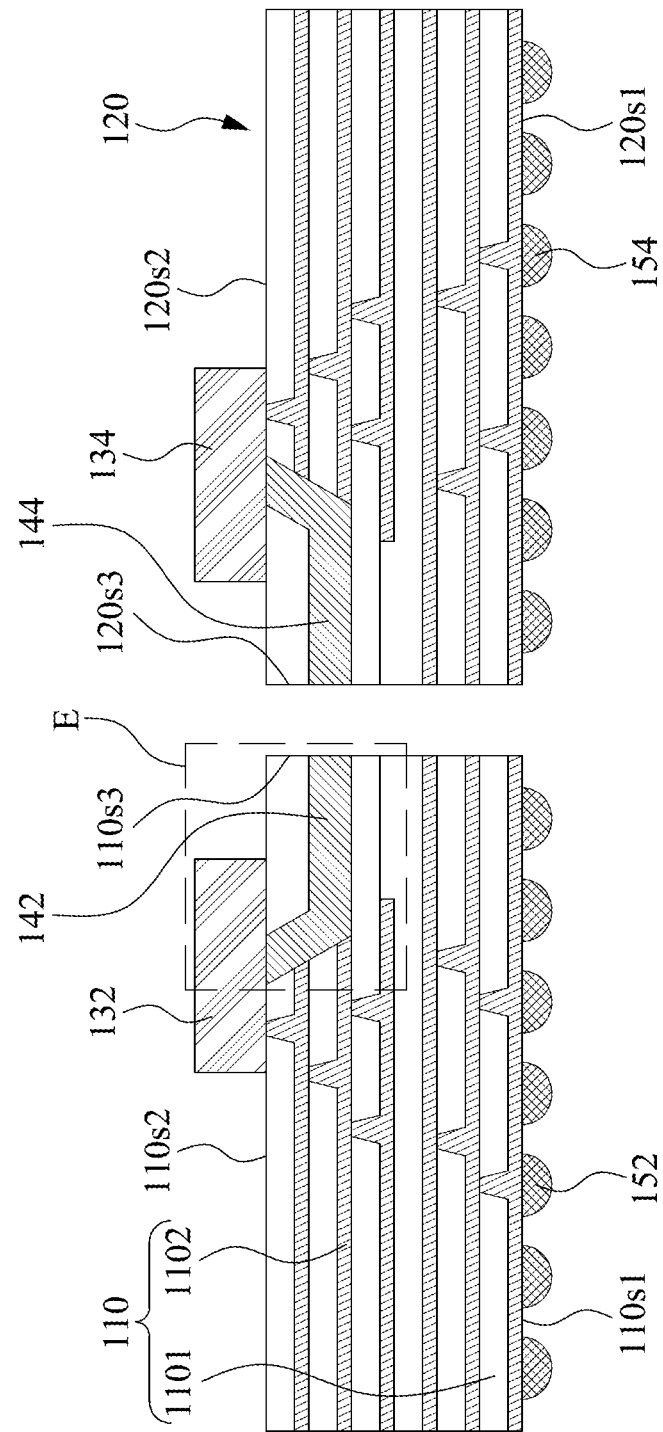
FIG. 1 illustrates a cross-sectional view of an example of an electronic package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an example of an electronic package structure 100a according to some embodiments of the present disclosure.

In some embodiments, the electronic package structure 100a may include carriers 110 and 120, electronic components 132 and 134, as well as optical channels 142 and 144.

In some embodiments, the carrier 110 may be configured to support or accommodate the electronic component 132. In some embodiments, the carrier 110 may be configured to support or accommodate the optical channel 142. The carrier 110 may include a surface 110$s$1, a surface 110$s$2 opposite to the surface 110$s$1, and a surface 110$s$3 extending between the surface 110$s$1 and the surface 110$s$2. The surface 110$s$3 may face the electronic component 134. In some embodiments, the carrier 110 may include a fan-out substrate. The carrier 110 may include a redistribution structure, which may include a dielectric structure 1101 and conductive layers (e.g., traces) 1102 embedded in the dielectric structure 1011.

The material of the dielectric structure 1011 may include polymeric materials or oxides. In some embodiments, the material of the dielectric structure 1011 may include Prepreg (PP), Ajinomoto build-up film (ABF) or other suitable materials. In some embodiments, a resin material used in the carrier 110 may be a fiber-reinforced resin so as to strengthen the carrier 110, and the reinforcing fibers may be, without limitation to, glass fibers or Kevlar fibers (aramid fibers). Dielectric layers of the dielectric structure 1101 may be stacked along the Y direction.

The conductive layers (e.g., traces) 1102 may be disposed on a corresponding dielectric layer of the dielectric structure 110. The material of the conductive layers 1102 may include, for example, conductive materials, such as copper (Cu), aluminum (Al), iron (Fe), zinc (Zn), nickel (Ni), tin (Sn), lead (Pb), silver (Ag), mercury (Hg), gold (Au) or a combination thereof.

The carrier 110 may include a plurality conductive vias, which may be configured to electrically connect the conductive layers 1102 in different horizontal levels or in different dielectric layers of the dielectric structure 1101.

In some embodiments, the electronic component 132 may be disposed on the surface 110$s$2 of the carrier 110. The electronic component 132 can be configured to process, receive, and/or transmit electrical signals. In some embodiments, the electronic component 132 may be an optoelectronic component, which can be configured to process, receive, and/or transmit electrical and optical signals. The electronic component 132 can convert the optical signals to electric signals or convert the electric signals to optical signals. The electronic component 132 may include a semiconductor die or a chip, such as a logic die (e.g., system-on-a-chip (SoC), central processing unit (CPU), graphics processing unit (GPU), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die) or other components. In some embodiments, the electronic component 132 may include, but is not limited to, a photonic integrated circuit (PIC), electronic integrated circuit (EIC) or other suitable components.

In some embodiments, the optical channel 142 may be embedded in the carrier 110. In some embodiments, the optical channel 142 may be exposed from the surface 110$s$3 of the carrier 110. The optical channel 142 may be configured to signally couple the electronic components 132 and 134. In some embodiments, the optical channel 142 may be configured to optically couple the electronic components 132 and 134. In some embodiments, the optical channel 142 may be configured to transmit signals to the electronic component 132 or receive signals from the electronic component 132.

In some embodiments, the carrier 120 may be configured to support or accommodate the electronic component 134. In some embodiments, the carrier 120 may be configured to support or accommodate the optical channel 144. The carrier 120 may include a surface 120$s$1, a surface 120$s$2 opposite to the surface 120$s$1, and a surface 120$s$3 extending between the surface 120$s$1 and the surface 120$s$2. The carrier 120 may include a redistribution structure, which may include a plurality of dielectric layers, traces and conductive vias. In some embodiments, the carrier 120 may be a core substrate, which has a structure and material similar to those of the carrier 110.

In some embodiments, the electronic component 134 may be disposed on the surface 120$s$2 of the carrier 120. The electronic component 134 can be configured to process, receive, and/or transmit electrical signals. In some embodiments, the electronic component 134 may be an optoelectronic component, which can be configured to process, receive, and/or transmit electrical and optical signals. The electronic component 134 can convert the optical signals to electric signals or convert the electric signals to optical signals. The electronic component 134 may include a semiconductor die or a chip, such as a logic die (e.g., SoC, CPU), GPU, AP, microcontroller, etc.), a memory die (e.g., DRAM die, SRAM die, etc.), a power management die (e.g., PMIC die), an RF die, a sensor die, a MEMS die, a signal processing die (e.g., DSP die), a front-end die (e.g., AFE die) or other components. In some embodiments, the electronic component 134 may include, but is not limited to, a PIC, EIC or other suitable components. In some embodiments, the electronic component 132 may be signally coupled with the electronic component 134. In some embodiments, the electronic component 132 may be optically coupled with the electronic component 134 through the optical channel 142 and/or 144. In some embodiments, the signal of the electronic component 132 may be transmitted to the electronic component 134 without passing through a conductive trace made of metal and/or alloy.

In some embodiments, the optical channel 144 may be embedded in the carrier 120. In some embodiments, the optical channel 144 may be exposed from the surface 120$s$3 of the carrier 120. The optical channel 144 may be configured to signally couple the electronic components 132 and 134. In some embodiments, the optical channel 144 may be configured to optically couple the electronic components 132 and 134. The optical channel 144 may be configured to transmit signals to the electronic component 134 or receive signals from the electronic component 134.

In some embodiments, the optical channels 142 and 144 may be spaced apart from each other by a gap. In some embodiments, the optical channel 144 may be signally coupled with the optical channel 142. In some embodiments, the optical channel 144 may be optically coupled with the optical channel 142. In some embodiments, the optical channel 142 may be at least partially aligned to or overlap the optical channel 144 along the X direction. In some embodiments, the space (or gap) between the optical channels 142 and 144 may be filled with air, fillers or other suitable materials.

In some embodiments, the electronic package structure 100$a$ may further include terminals 152 and 154. The terminals 152 may be disposed on the surface 110$s$1 of the carrier 110. The terminals 154 may be disposed on the surface 120$s$1 of the carrier 120. The terminals 152 and/or 154 may be configured to electrically connect the electronic component 132 (or electronic component 134) to an external component (not shown), such as a printed circuit board. The terminals 152 and/or 154 may include a solder ball (e.g., Sn ball).

Figure 2A:
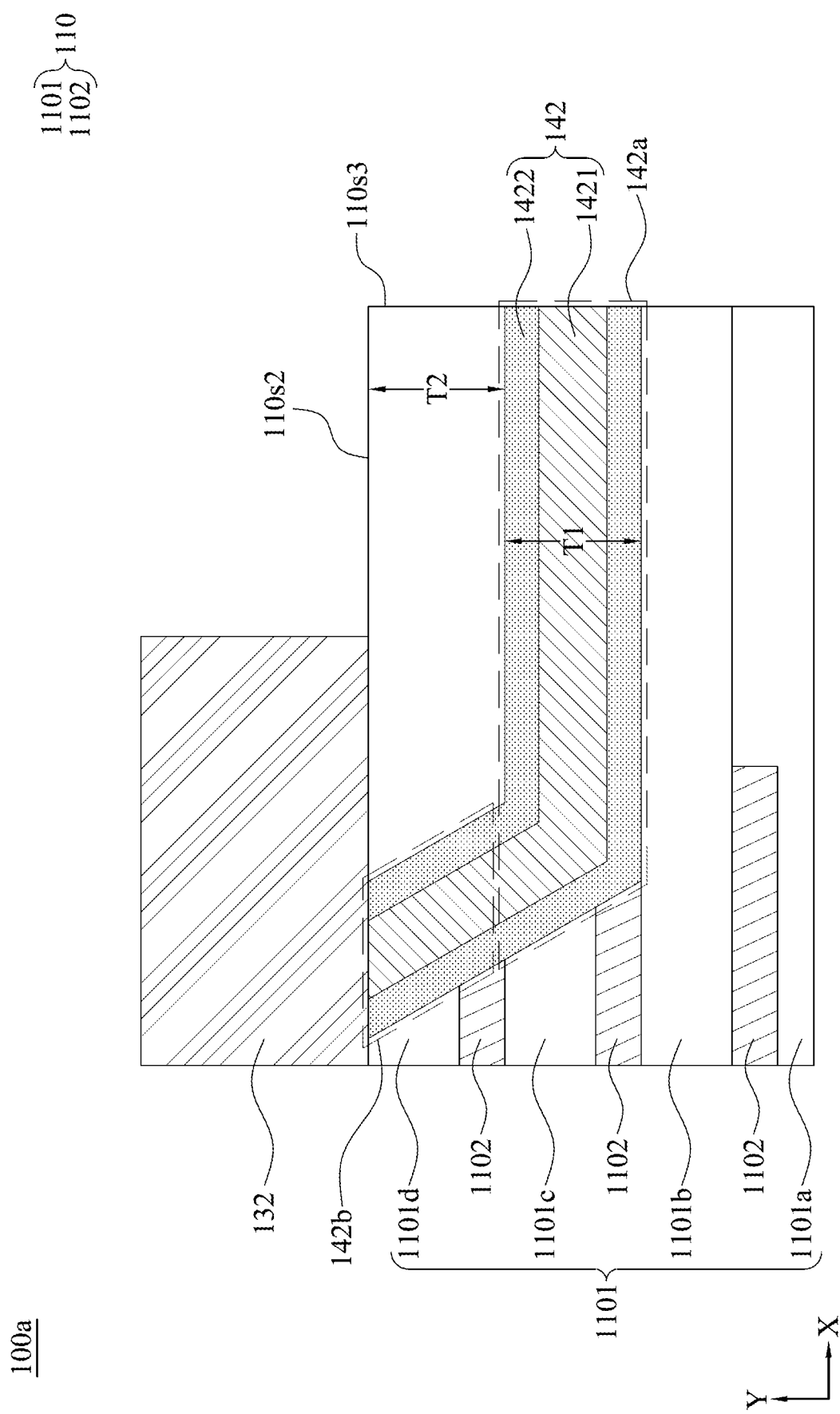
FIG. 2A illustrates a partial enlarged view of an example of the electronic package structure of FIG. 1 according to some embodiments of the present disclosure.

FIG. 2A illustrates a partial enlarged view of region E of the electronic package structure 100a of FIG. 1 according to some embodiments of the present disclosure.

As shown in FIG. 2A, the dielectric structure 1101 may include dielectric layers 1101a, 1101b, 1101c, and 1101d stacked along the Y direction. The dielectric layer 1101d is the topmost layer of the carrier 110.

In some embodiments, the optical channel 142 may include an optical signal transmission layer 1421 and a cladding layer 1422.

The optical signal transmission layer 1421 may be configured to receive or transmit optical signals, such as lights. The optical signal transmission layer 1421 may be embedded in or surrounded by the cladding layer 1422. In some embodiments, the optical signal transmission layer 1421 may be in contact with the electronic component 132. In some embodiments, the lateral surface of the optical signal transmission layer 1421 may be exposed from the cladding layer 1422. In some embodiments, the lateral surface of the optical signal transmission layer 1421 may be exposed from the surface 110s3 of the carrier 110. In some embodiments, the lateral surface of the cladding layer 1422 may be exposed from the surface 110s3 of the carrier 110. In some embodiments, the optical signal transmission layer 1421 may extend from the surface 1102 to the surface 1103 of the carrier 110. The material of the optical signal transmission layer 1421 is different from that of the cladding layer 1422. In some embodiments, the refractive index of the material of optical signal transmission layer 1421 may be greater than that of the cladding layer 1422. In some embodiments, the optical signal transmission layer 1421 may include a semiconductor material. For example, the optical signal transmission layer 1421 may include or be composed of silicon, germanium, silicon carbide (SiC), silicon nitride, germanium silicide (SiGe), gallium arsenide (GaAs), a combination thereof or other suitable materials.

The cladding layer 1422 may surround the optical signal transmission layer 1421. The cladding layer 1422 may include or be composed of oxide, such as silicon oxide ($SiO_2$), yttrium oxide ($Y_2O_3$), aluminum oxide or other suitable materials. In some embodiments, the cladding layer 1422 may be in contact with the dielectric layers (e.g., 1101c and 1101d) and/or the trace(s) 1102 of the carrier 110.

In some embodiments, the optical channel 142 may include a bending portion. For example, the optical channel 142 may include a portion 142a and a portion 142b disposed on the portion 142a. The portions 142a and 142b extend along different directions. In some embodiments, the portion 142a may extend along the X direction, and the portion 142b may extend along a direction slanted with respect to that of the portion 142a. In some embodiments, the optical signal transmission layer 1421 of the portion 142b is slanted with respect to the optical signal transmission layer 1421 of the portion 142a. The portion 142b may be disposed between the carrier 110 and the portion 142a. The portion 142b may be exposed from the surface 110s2 of the carrier 110. Each of the portions 142a and 142b may include both the optical signal transmission layer 1421 and the cladding layer 1422. The portion 142a may have a thickness T1 along the Y direction. The portion 142b may have a thickness T2 along the Y direction. In some embodiments, the thickness T1 may be substantially the same as the thickness T2. In some other embodiments, the thickness T1 may be different from the thickness T2. In some other embodiments, the thickness T1 may be less than the thickness T2. In some embodiments, the optical signal transmission layer 1421 may continuously extend from the portion 142a to the portion 142b. That is, the optical signal transmission layer 1421 is a continuous material extending from the portion 142a to the portion 142b, For example, no interface is generated or formed within the optical signal transmission layer 1421 during manufacturing processes or steps, and thus no interface is observed within the optical signal transmission layer 1421. In some embodiments, the optical signal transmission layer 1421 includes a homogenous material extending from the surface 110s2 to the surface 110s3 of the carrier 110. For example, when optical signal transmission layer 1421 includes silicon (e.g., homogenous silicon), homogenous silicon extends from the surface 110s2 to the surface 110s3 of the carrier 110.

In a comparative example, electronic components are signally coupled by electrical transmission. With increase of the increase of the amount of data or the speed of signal transmission, signal loss may become significant when conductive traces are used as a medium to transmit signals. In some embodiment according to the present disclosure, an optical channel is used so that the signal transmission from or to the electronic component 132 can be done through the optical channel, which can reduce signal loss and is applicable to high-speed data transmission.

A comparative package structure includes electronic components, carriers on which respective electronic components are disposed, and a printed circuit board on which carriers are disposed. An optical channel is disposed on an upper surface of the printed circuit board. Electrical signals are converted to optical signals and transmitted through the optical channel. The electronic components of the comparative semiconductor device are signally coupled with each other through carriers and the optical channel. The signals may pass through the carriers and optical channel, resulting in a longer conductive path. In comparison with aforesaid comparative example, in the package structure according to the present disclosure, the optical channel 142 is embedded in the carrier 110, and the distance between the optical channel 142 and the electronic component 132 is relatively short, which may also reduce the size of the package structure. Further, the signal coupling between two electronic components (e.g., 132 and 134) can be achieved by optical channels 142 and 144 instead of traces of the carrier 110. Thus, signal loss can be further reduced in comparison with the comparative example.

In some embodiments, the carrier 110 includes a redistribution structure and an optical interconnect structure. The redistribution structure includes dielectric layers 1101 and conductive layers 1102 and the optical interconnect structure is embedded in the redistribution structure. Therefore, the carrier can electrical or optical communicated with electronic components when necessary. In some embodiments, the electronic component is optically coupled with the optical interconnect structure so that the optical signals can be transmitted from or to the electronic component in a short path and the carrier can be applied to high speed or high frequency applications.

Figure 2B:
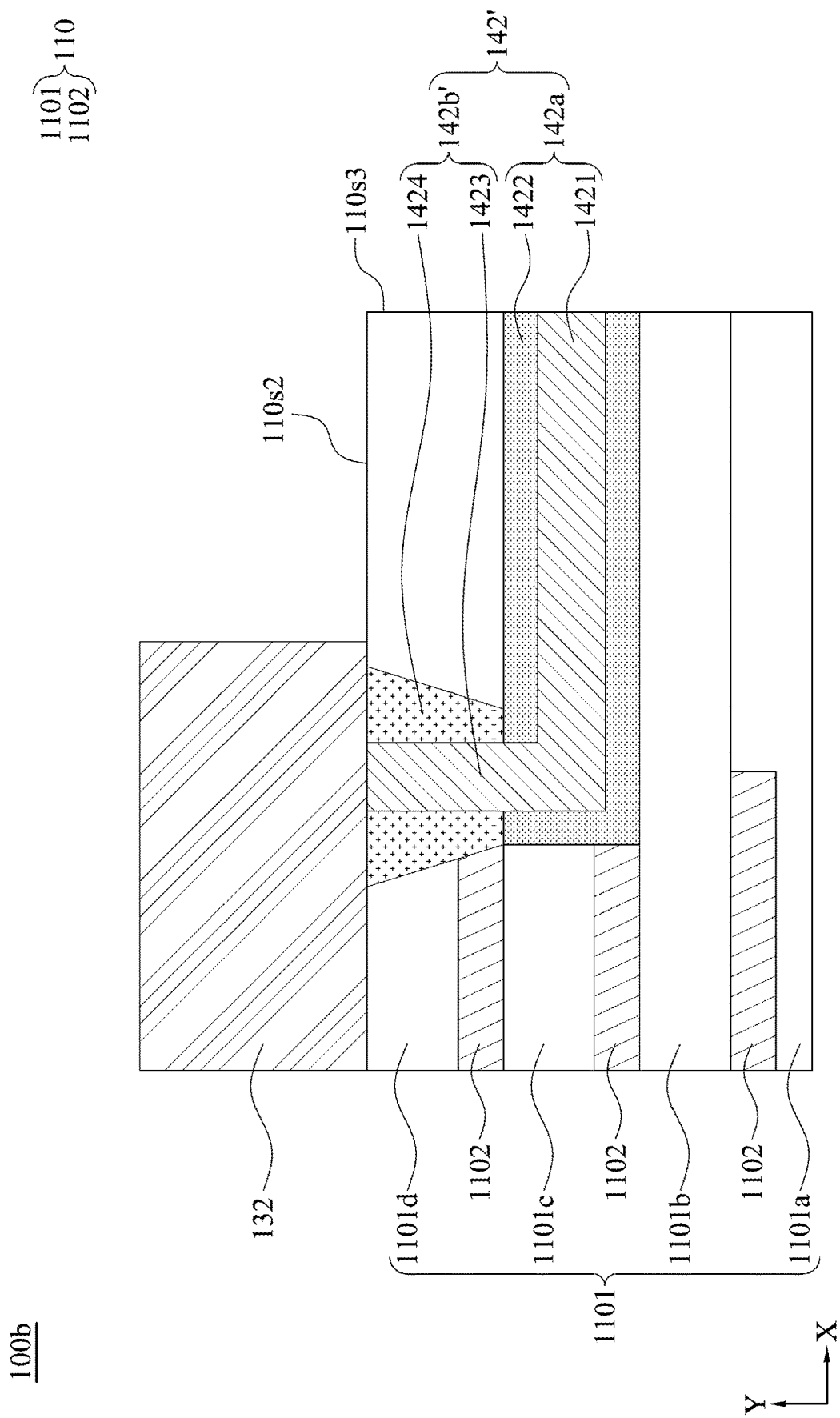
FIG. 2B illustrates a cross-sectional view of an example of an electronic package structure according to some embodiments of the present disclosure.

FIG. 2B illustrates a cross-sectional view of an example of an electronic package structure 100b according to some embodiments of the present disclosure. The electronic package structure 100b of FIG. 2B has a structure similar to that of the electronic package structure 100a of FIG. 2A with differences in that the electronic package structure 100b may include an optical channel 142' replacing the optical channel 142.

The optical channel 142' may be embedded in the carrier 110. The optical channel 142' may include a portion 142b' disposed on the portion 142a. In some embodiments, the portion 142b' may be tapered along the Y direction. In some embodiments, the portion 142b" may be tapered toward a lower surface (e.g., 110l) of the carrier 110.

The portion 142b' may include an optical signal transmission layer 1423 and a cladding layer 1424. The material of the optical signal transmission layer 1423 may be the same as or similar to that of the optical signal transmission layer 1421. In some embodiments, the optical signal transmission layer 1423 may extend along the Y direction. In some embodiments, the optical signal transmission layer 1423 may be substantially orthogonal to the optical signal transmission layer 1421. In some embodiments, the signal transmission layers 1421 and 1423 may be formed in one-piece. In some embodiments, the signal transmission layers 1421 and 1423 may be formed by different steps, and may have an interface between them.

The cladding layer 1424 may surround the optical signal transmission layer 1423. In some embodiments, the cladding layer 1424 may be tapered toward the portion 142a. In some embodiments, the refractive index of the material of optical signal transmission layer 1423 may be greater than that of the cladding layer 1424. In some embodiments, the material of the cladding layer 1424 may be the same as that of the cladding layer 1422. In some embodiments, the material of the cladding layer 1424 may be different from that of the cladding layer 1422.

Figure 2C:
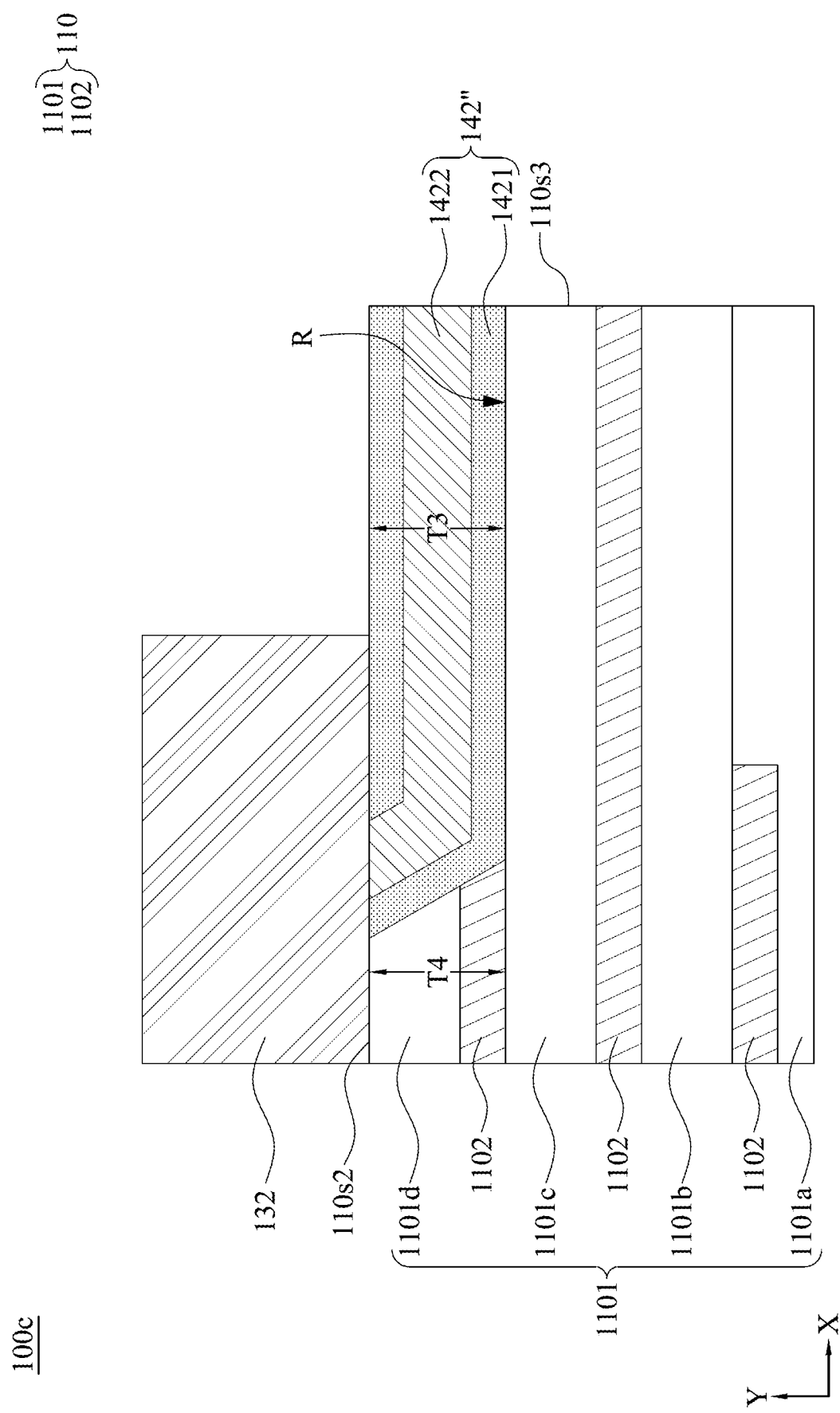
FIG. 2C illustrates a cross-sectional view of an example of an electronic package structure according to some embodiments of the present disclosure.

FIG. 2C illustrates a cross-sectional view of an example of an electronic package structure 100c according to some embodiments of the present disclosure. The electronic package structure 100c of FIG. 2C has a structure similar to that of the electronic package structure 100a of FIG. 2A with differences in that the electronic package structure 100c may include an optical channel 142" replacing the optical channel 142.

In some embodiments, the carrier 110 may include a recess R recessed from the surface 110s2 of the carrier 110. The recess R may be formed by removing a portion of the dielectric layer 1101d. In some embodiments, the optical channel 142" may be disposed within the recess R of the carrier 110. In some embodiments, the upper surface of the optical channel 142" is not covered by the dielectric structure 1101 of the carrier 110. The optical channel 142" may have a thickness T3 (or height) along the Y direction. The dielectric layer 1101d may have a thickness T4 (or height) along the Y direction. In some embodiments, the thickness T3 may be substantially the same as the thickness T4.

In this embodiment, the optical channel 142" is integrated with the carrier 110, and the distance between the optical channel 142" and the electronic component 132 is relatively short. Thus, signal loss can be reduced in comparison with a comparative example. Further, in the some embodiments (e.g., those illustrated in FIG. 2A), after the formation or disposal of the optical channel, a further layer (e.g, dielectric layer 1101d in FIG. 2A) needs to be formed or laminated over the optical channel so that the optical channel is embedded in the carrier. In the embodiments illustrated in FIG. 2C, since the optical channel 142" is disposed adjacent to the upper surface of carrier 10 and an outermost surface of the cladding layer 1421 is exposed from the carrier 10, the step of lamination or disposal of a further dielectric over the optical channel may be omitted.

Figure 2D:
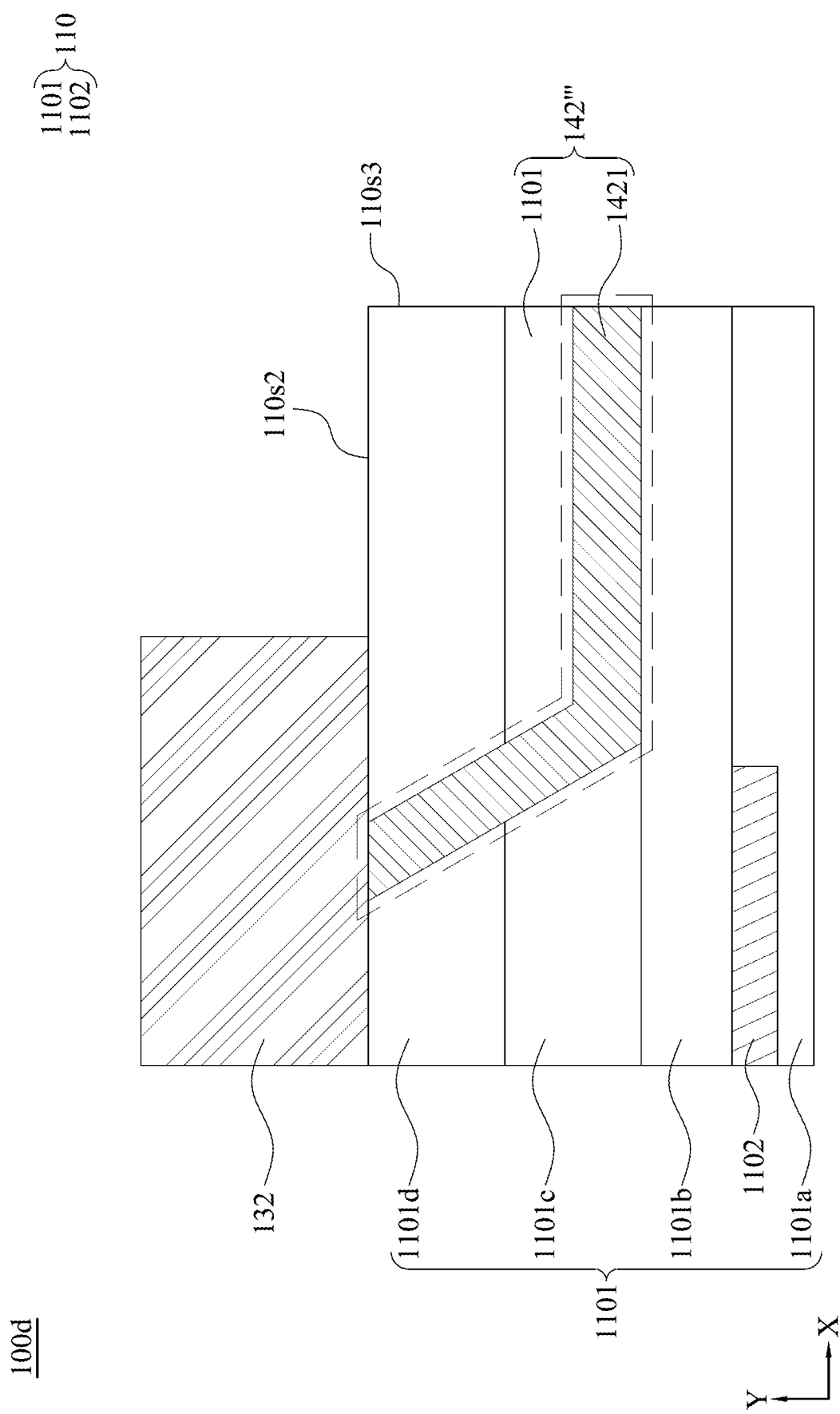
FIG. 2D illustrates a cross-sectional view of an example of an electronic package structure according to some embodiments of the present disclosure.

FIG. 2D illustrates a cross-sectional view of an example of an electronic package structure 100d according to some embodiments of the present disclosure. The electronic package structure 100d of FIG. 2D has a structure similar to that of the electronic package structure 100a of FIG. 2A with differences in that the electronic package structure 100d may include an optical channel 142''' replacing the optical channel 142.

In some embodiments, a portion of the dielectric structure 1101 may serve as the cladding layer of the optical channel 142'''. A portion of the dielectric structure 1101 and the optical signal transmission layer 1421 may constitute the optical channel 142'''. In this embodiment, the optical signal transmission layer 1421 may be in contact with the dielectric structure 1101 of the carrier 110. In some embodiments, the carrier 110 may function as a cladding layer. In some embodiments, the refractive index of the material of optical signal transmission layer 1421 may be greater than that of the dielectric structure 1101.

In this embodiment, the optical channel 142''' is embedded in the carrier 110, and the distance between the optical channel 142''' and the electronic component 132 is relatively short. Thus, signal loss can be reduced in comparison with a comparative example.

Figure 2E:
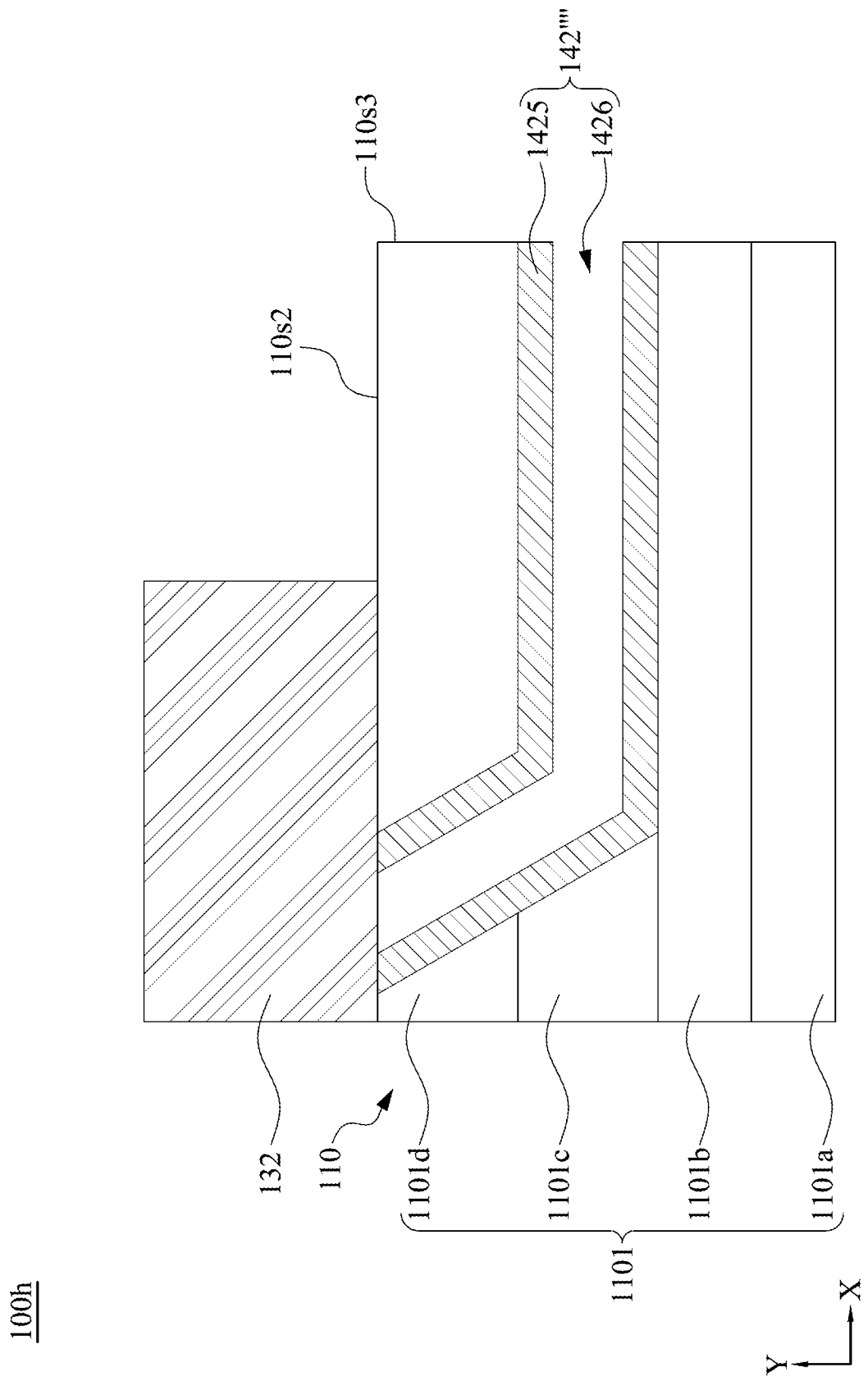
FIG. 2E illustrates a cross-sectional view of an example of an electronic package structure according to some embodiments of the present disclosure.

FIG. 2E illustrates a cross-sectional view of an example of an electronic package structure 100h according to some embodiments of the present disclosure. The electronic package structure 100h of FIG. 2E has a structure similar to that of the electronic package structure 100a of FIG. 2A with differences in that the electronic package structure 100e may include an optical channel 142'''' replacing the optical channel 142.

In some embodiments, the optical channel 142'''' may be in the shape of a hollow tube. In some embodiment, the optical channel 142'''' may be a hollow metal tube, such as a hollow metal waveguide which includes a metal layer 1425 with a ring profile in a cross sectional view, and air 1426 may be filled with the hollow portion of the metal layer 1425.

Figure 3:
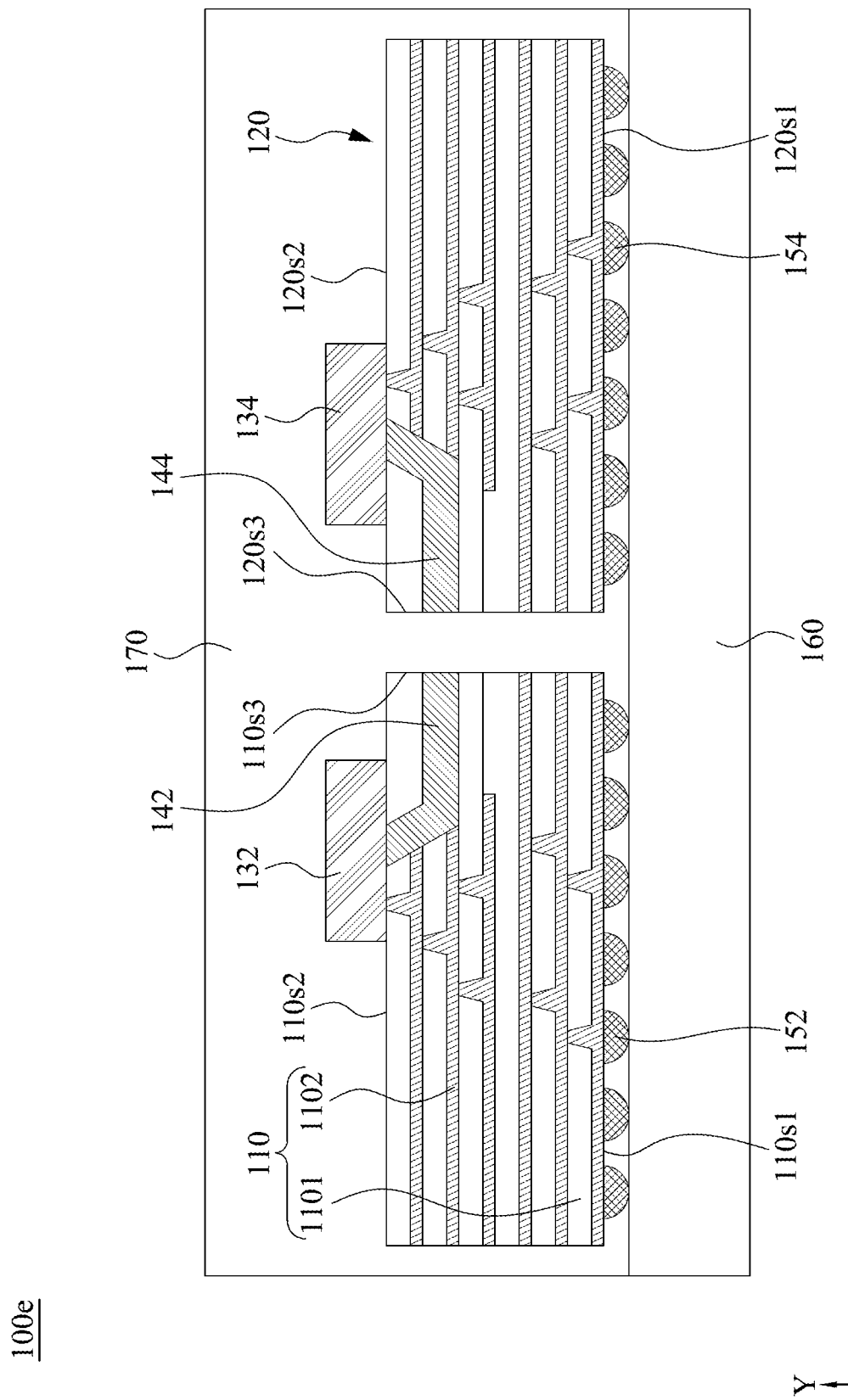
FIG. 3 illustrates a cross-sectional view of an example of an electronic package structure according to some embodiments of the present disclosure.

FIG. 3 illustrates a cross-sectional view of an example of an electronic package structure 100e according to some embodiments of the present disclosure. The electronic package structure 100e of FIG. 3 has a structure similar to that of the electronic package structure 100a of FIG. 1 with differences in that the electronic package structure 100e may include a circuit board 160 and an encapsulant 170. Further, the optical channel 142', 142", or 142''' shown in FIGS. 2B, 2C, and 2D can be applicable to the electronic package structure 100e.

The circuit board 160 may be configured to support the carriers 110 and 120. The circuit board 160 may be configured to provide power or ground to the electronic component 132 and/or 134. The circuit board 160 may be electrically connected to the electronic component 132 through the terminals 152 of the carrier 110. The circuit board 160 may be electrically connected to the electronic component 134 through the terminals 154 of the carrier 120. The circuit board 160 may include a printed circuit board, such as a paper-based copper foil laminate, a composite copper foil laminate, or a polymer-impregnated glass-fiber-based copper foil laminate. The circuit board 160 may include a redistribution structure embedded in a substrate, such as a polymethyl methacrylate substrate. In some embodiments, a line width (or pitch) of the traces 1102 (or redistribution structure) of the carrier 110 may be less than that of the redistribution structure of the circuit board 160.

The encapsulant 170 may be disposed on the circuit board 160. The encapsulant 170 may encapsulate the carriers 110 and 120. The encapsulant 170 may encapsulate the electronic components 132 and 134. The encapsulant 170 may fill the space between the optical channels 142 and 144. The encapsulant 170 may include insulation or dielectric material. In some embodiments, the encapsulant 170 may be made of molding material that may include, for example, a Novolac-based resin, an epoxy-based resin, a silicone-based resin, or other another suitable encapsulant. Suitable fillers may also be included, such as powdered $SiO_2$. In some embodiments, the encapsulant 170 may be optically transparent with respect to wavelength of signals transmitted between the electronic components 132 and 134. The transmittance of the encapsulant 170, with respect to wavelength of signals transmitted between the electronic components 132 and 134, may exceed 80%, such as 80%, 85%, 90%, 93%, 95%, 97%, 99% or more.

In this embodiment, the optical channel 142 is embedded in the carrier 110, and the distance between the optical channel 142 and the electronic component 132 is relatively short. Thus, the signal loss can be reduced in comparison with a comparative example.

Figure 4:
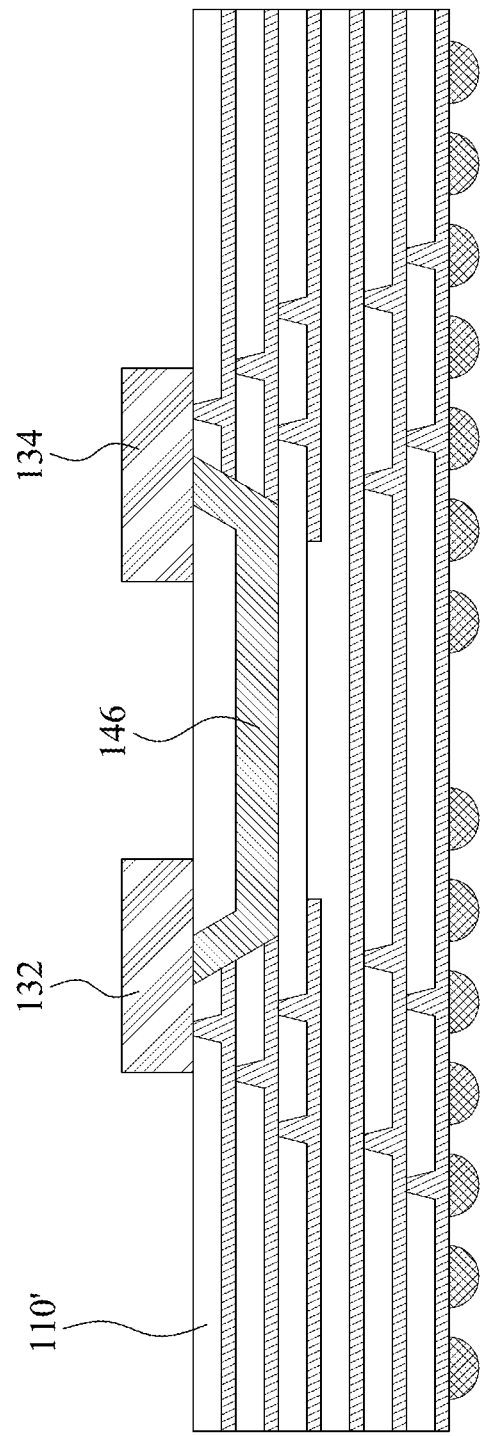
FIG. 4 illustrates a cross-sectional view of an example of an electronic package structure according to some embodiments of the present disclosure.

FIG. 4 illustrates a cross-sectional view of an example of an electronic package structure 100f according to some embodiments of the present disclosure. The electronic package structure 100f of FIG. 4 has a structure similar to that of the electronic package structure 100a of FIG. 1 with differences in that the electronic package structure 100f may include a carrier 110' and an optical channel 146.

The structure and the material of the carrier 110' may be the same as or similar to those of the carrier 110. In some embodiments, the electronic component 132 may be disposed on the carrier 110'. The electronic component 134 may also be disposed on the carrier 110'.

In some embodiments, the optical channel 146 may be embedded in the carrier 110'. The optical channel 146 may be configured to signally couple the electronic components 132 and 134. In some embodiments, the optical channel 146 may be configured to optically couple the electronic components 132 and 134. In some embodiments, the electronic component 132 may be in contact with the optical channel 146. In some embodiments, the electronic component 134 may be in contact with the optical channel 146. In some embodiments, the optical channel 146 may continuously extend from the electronic component 132 to the electronic component 134. The material of the optical channel 146 may be the same as or similar to that of the optical channel 142.

In this embodiment, the optical channel 146 is embedded in the carrier 110', and the distance between the optical channel 146 and the electronic component 132 is relatively short. Thus, signal loss can be reduced in comparison with a comparative example.

Figure 5:
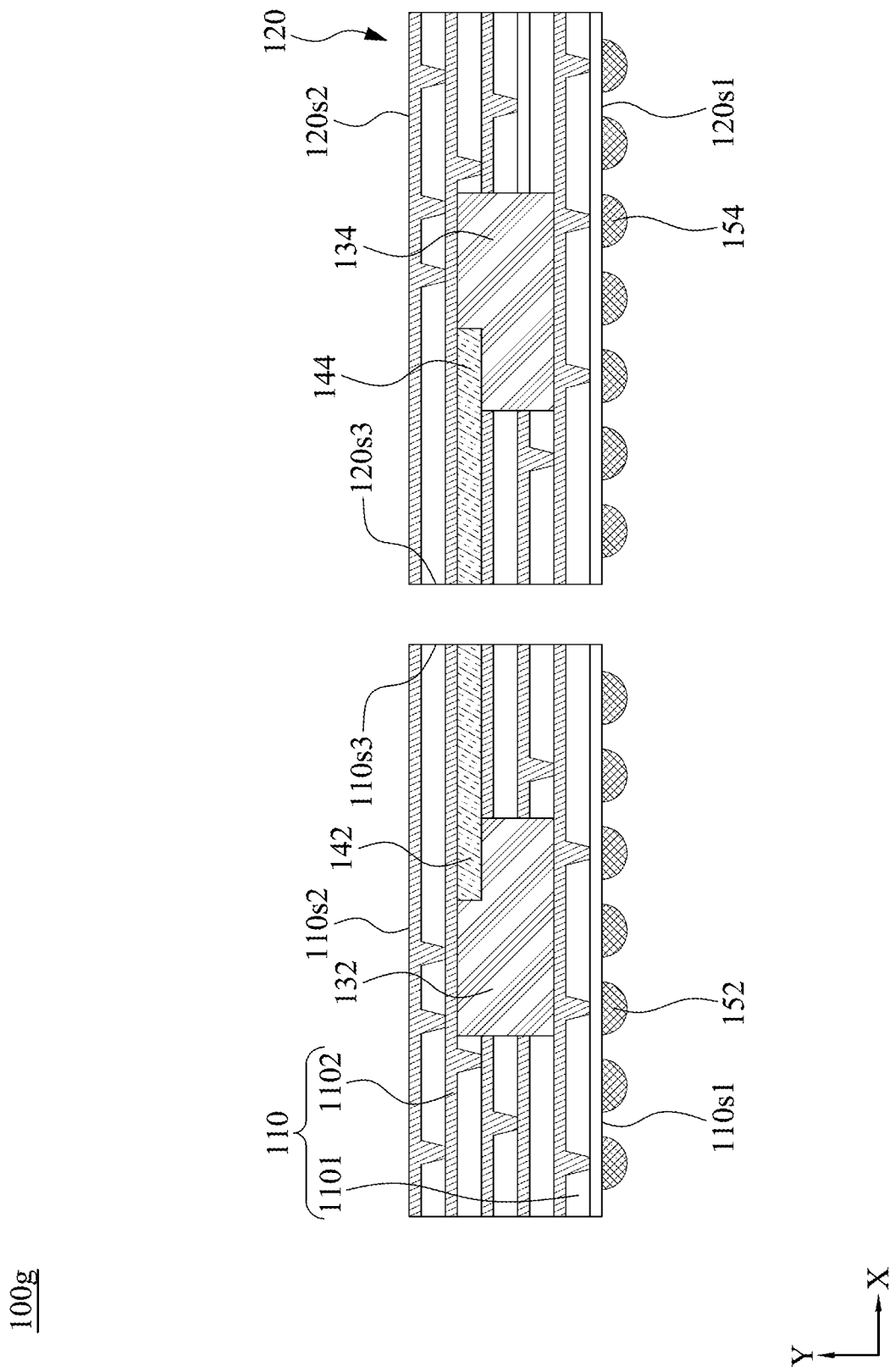
FIG. 5 illustrates a cross-sectional view of an example of an electronic package structure according to some embodiments of the present disclosure.

FIG. 5 illustrates a cross-sectional view of an example of an electronic package structure 100g according to some embodiments of the present disclosure. The electronic package structure 100g of FIG. 5 has a structure similar to that of the electronic package structure 100a of FIG. 1 with differences in that electronic package structure 100f may include electronic components 132 and 134 embedded in the carriers 110 and 120, respectively.

In some embodiments, both the electronic component 132 and the optical channel 142 may be embedded in the carrier 110. In some embodiments, both the electronic component 134 and the optical channel 144 may be embedded in the carrier 120. In some embodiments, a portion of the substrate of the electronic component 132 may be removed so that the optical channel 142 may be inserted into a recess of the electronic component 132. In some embodiments, a portion of the substrate of the electronic component 134 may be removed so that the optical channel 144 may be inserted into a recess of the electronic component 134. In this embodiment, the optical channel 142 may serve as an optical interconnect structure, which is embedded in the redistribution structure (e.g., the dielectric structure 1101 and the conductive layers 1102) of the carrier 110. In some embodiments, the electronic component 132 may include a waveguide (not shown) coupled with the optical channel 142.

In this embodiment, the optical channel 142 is embedded in the carrier 110, and the distance between the optical channel 142 and the electronic component 132 is relatively short. Thus, the signal loss can be reduced in comparison with a comparative example.

FIGS. 6A, 6B, 6C and 6D illustrate various stages of an example of a method for manufacturing an electronic package structure 100a according to some embodiments of the present disclosure. More specifically, FIGS. 6A, 6B, 6C and 6D disclose an example of how to form an optical channel embedded in a carrier.

Figure 6A:
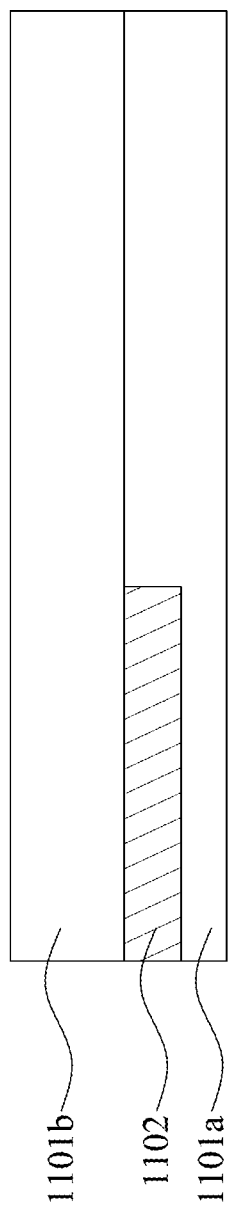
FIGS. 6A, 6B, 6C, and 6D illustrate various stages of an example of a method for manufacturing an electronic package structure according to some embodiments of the present disclosure.

Referring to FIG. 6A, the method begins with forming a carrier by providing dielectric layers (e.g., 1101a and 1101b) and the conductive layer 1102. The conductive layer 1102 may be formed and sandwiched by dielectric layers 1101a and 1101b. In some embodiments, the carrier in FIG. 6A may include more dielectric layers and conductive layers and as discussed below, in the subsequent steps, additional dielectric layers and conductive layers may be formed.

Figure 6B:
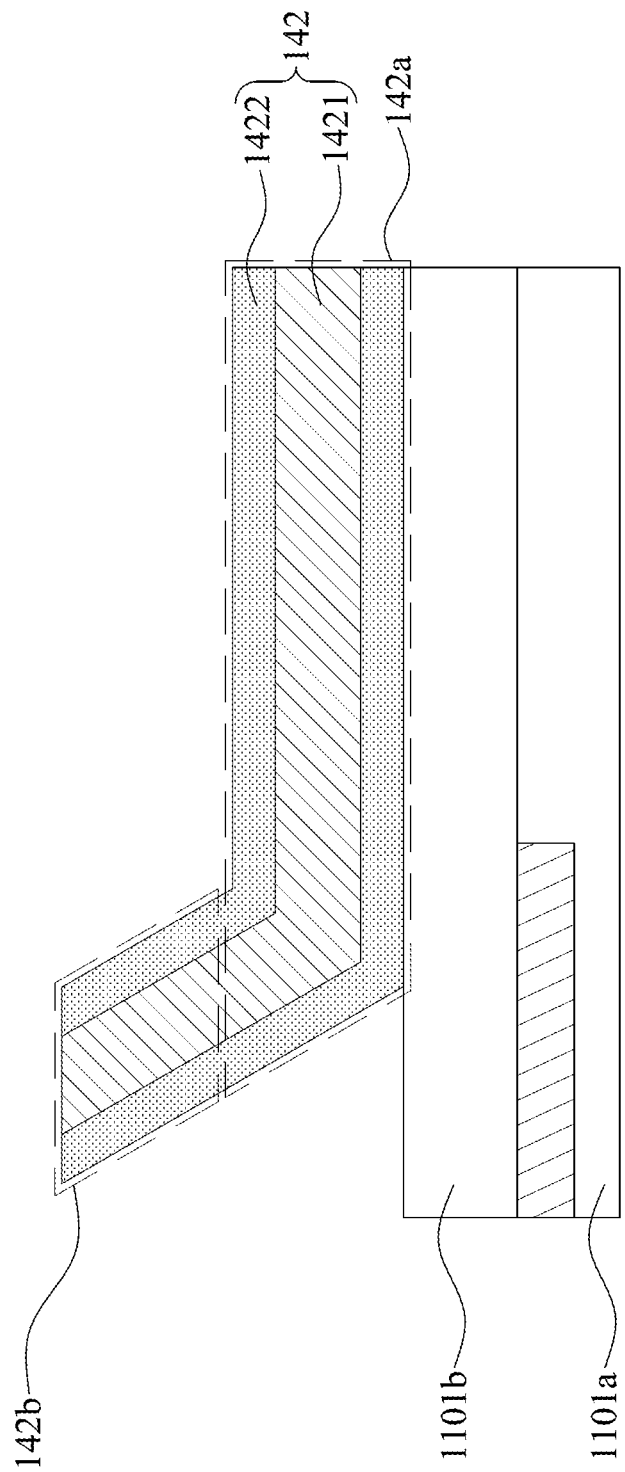

Referring to FIG. 6B, an optical channel 142, including an optical signal transmission layer 1421 and a cladding layer 1422, may be attached to the upper surface of the carrier (e.g., the dielectric layer 1101b as shown in FIG. 6A). In some embodiments, the optical channel 142 may be attached to the dielectric layer 1101b by an adhesive (not shown) or by other suitable materials.

Figure 6C:
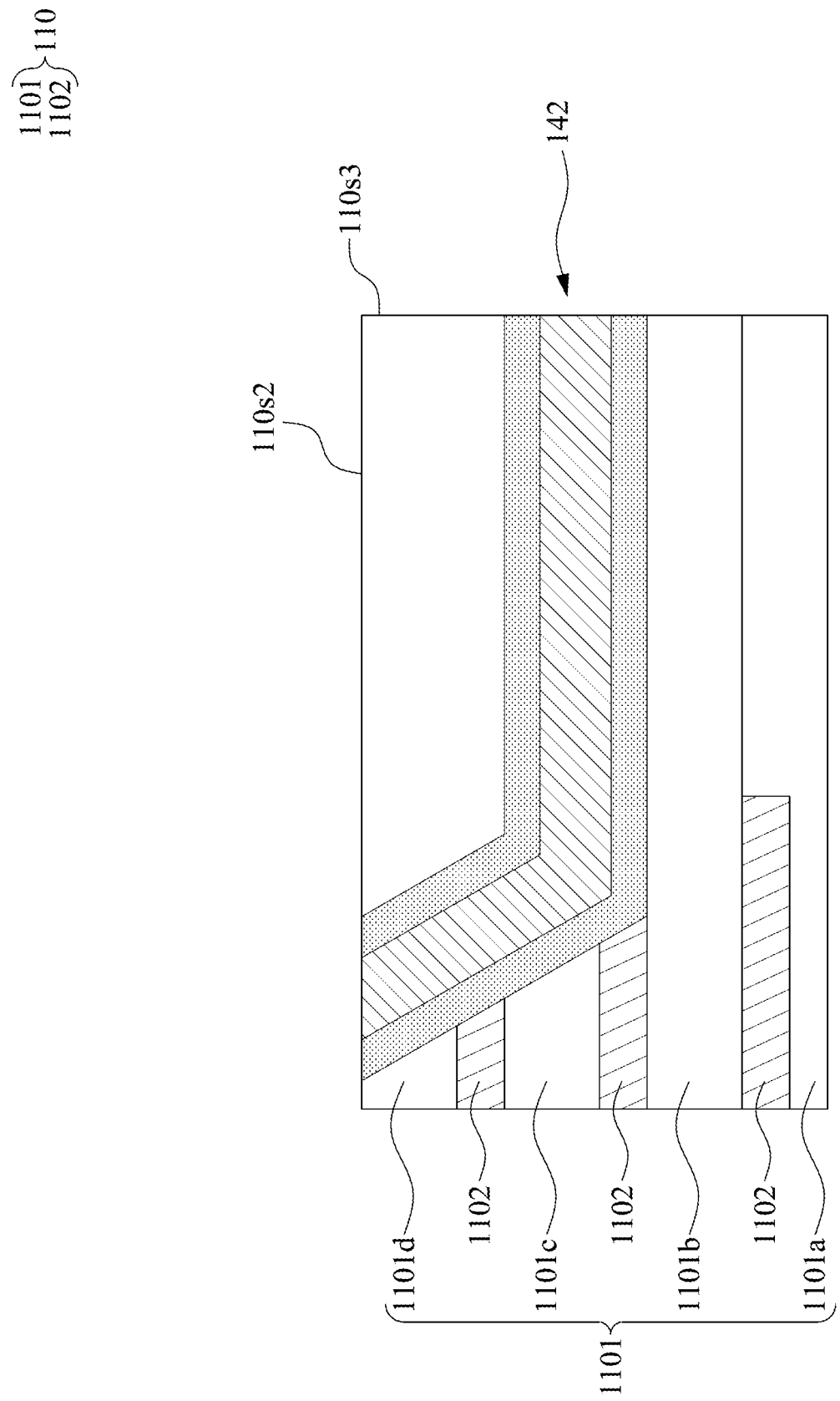

Referring to FIG. 6C, dielectric layer 1101c, dielectric layer 1101d, and traces (e.g., 1102) are formed on the dielectric layer 1101b to produce the dielectric structure 1101 and the carrier 110. The optical channel 142 may be embedded in the carrier 110, and exposed from surfaces 110s2 and 110s3 of the carrier 110.

Figure 6D:
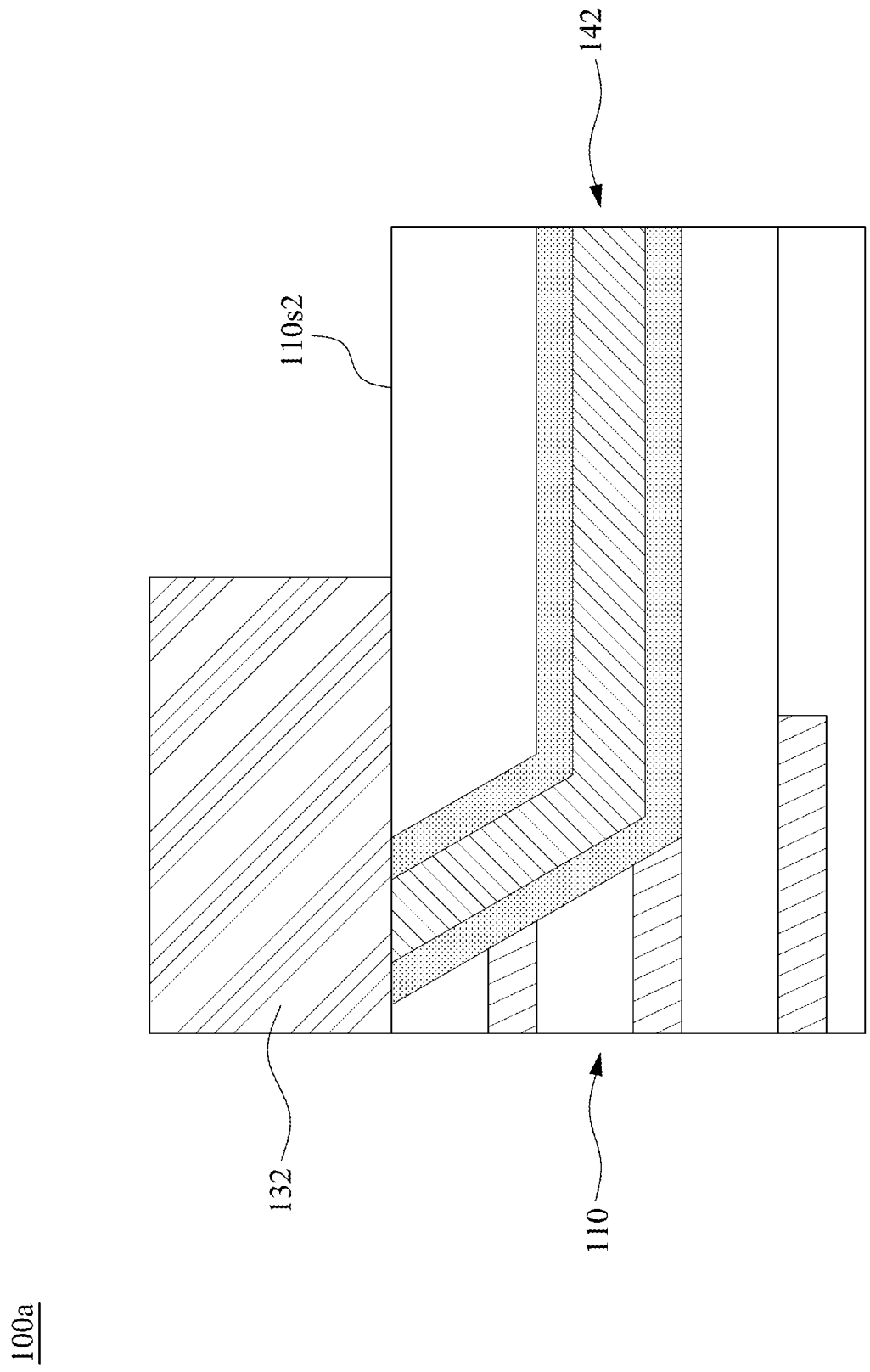

Referring to FIG. 6D, an electronic component 132 may be attached to the surface 110s2 of the carrier 110 so that the electronic component 132 may be in contact with the optical channel 142. Further, terminals (e.g., terminals 152 shown in FIG. 1) may be formed on a lower surface (e.g., surface 110s1) of the carrier 110. Further, another electronic component (e.g., electronic component 134 shown in FIG. 1), carrier (e.g., carrier 120 shown in FIG. 1), and optical channel (e.g., optical channel 144 shown in FIG. 1) may be provided by repeating steps shown in FIGS. 6A, 6B, 6C, and 6D, thereby forming the electronic package structure 100a.

FIGS. 7A, 7B, 7C, 7D, 7E, 7F, and 7G illustrate various stages of an example of a method for manufacturing an electronic package structure 100b according to some embodiments of the present disclosure.

Figure 7A:
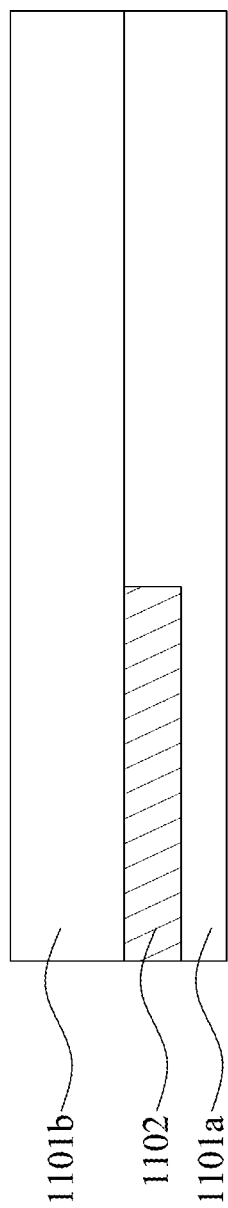
FIGS. 7A, 7B, 7C, 7D, 7E, 7F, and 7G illustrate various stages of an example of a method for manufacturing an electronic package structure according to some embodiments of the present disclosure.

Referring to FIG. 7A, the method begins with forming a carrier by providing dielectric layers (e.g., 1101a and 1101b) and the conductive layer 1102. The conductive layer 1102 may be formed and sandwiched by dielectric layers 1101a and 1101b. In some embodiments, the carrier in FIG. 7A may include more dielectric layers and conductive layers and as discussed below, in the subsequent steps, additional dielectric layers and conductive layers may be formed.

Figure 7B:
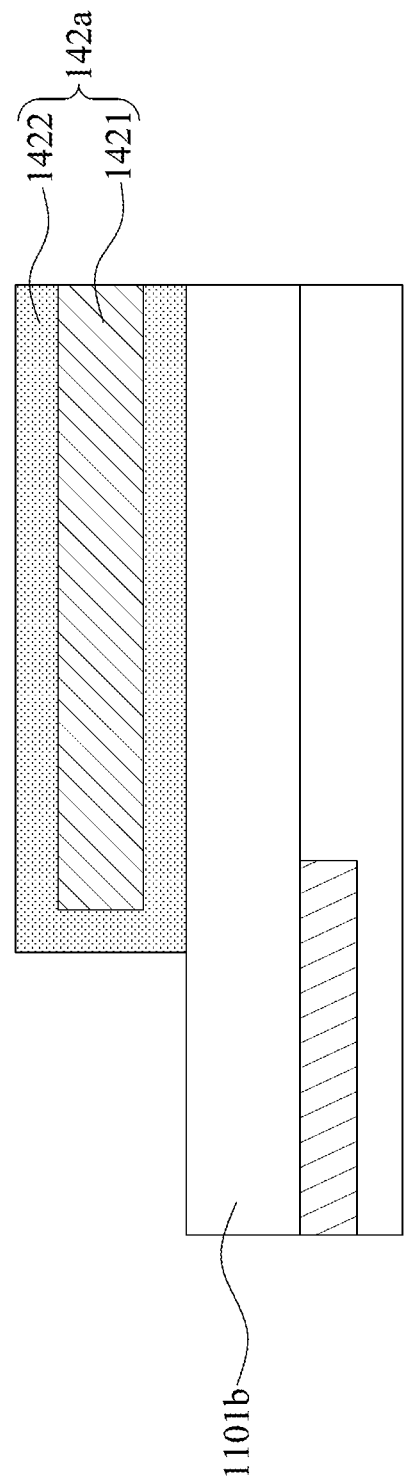

Referring to FIG. 7B, a portion 142a, including an optical signal transmission layer 1421 and a cladding layer 1422, may be attached to the upper surface of the dielectric layer 1101b by an adhesive (not shown) or other suitable materials.

Figure 7C:
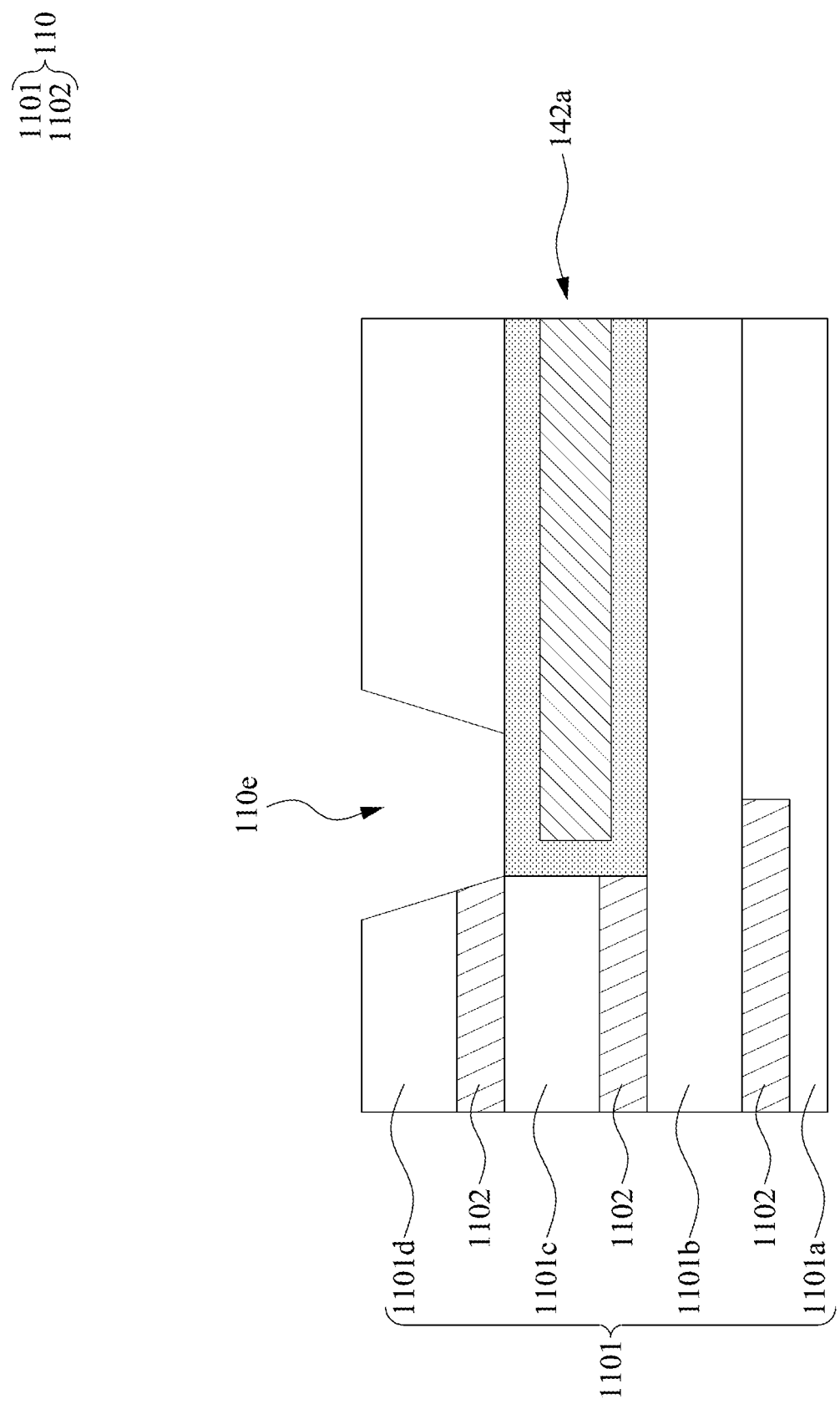

Referring to FIG. 7C, dielectric layers 1101c, 1101d, and a conductive layer or trace (e.g., 1102) are formed on the dielectric layer 1101b to produce the carrier 110. Further, an opening 110e may be formed to expose a portion of the portion 142a. The opening 110e may be formed by removing a portion of the dielectric layer 1101d. The dielectric layer 1101d may be removed by, for example, a laser drilling operation.

Figure 7D:
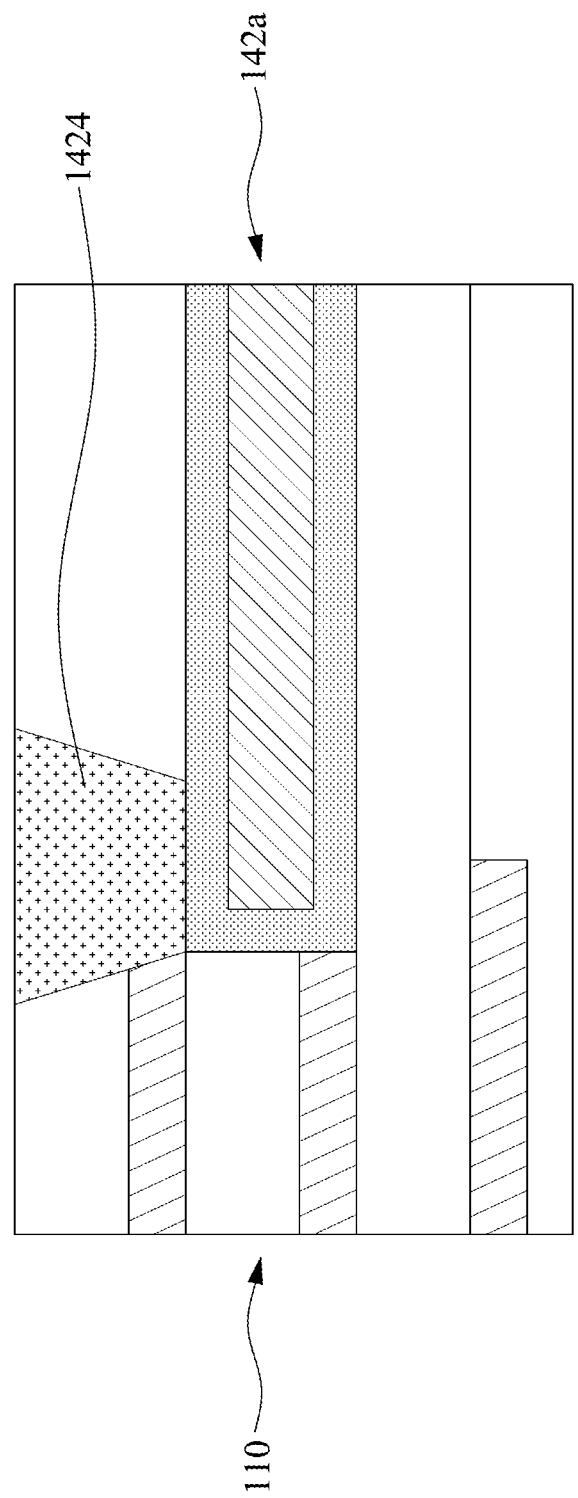

Referring to FIG. 7D, a cladding layer 1424 may be formed and fills the opening 110e of the carrier 110. The cladding layer 1424 may cover the portion 142a.

Figure 7E:
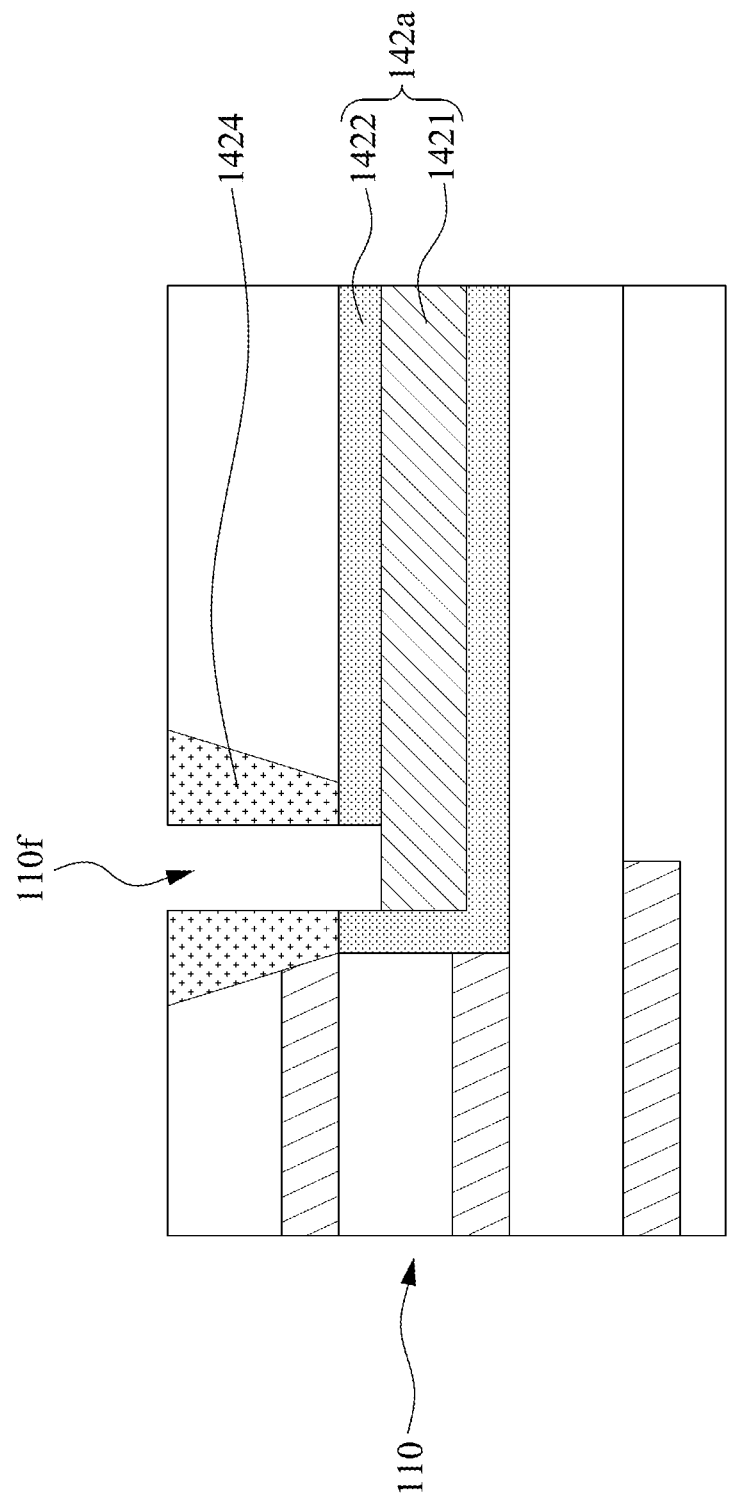

Referring to FIG. 7E, a removing operation, such as a laser drilling operation, may be performed to remove a portion of the cladding layer 1424 and the portion 142a, thereby forming an opening 110f. A portion of the cladding layer 1422 of the portion 142a may be removed to expose the optical signal transmission layer 1421.

Figure 7F:
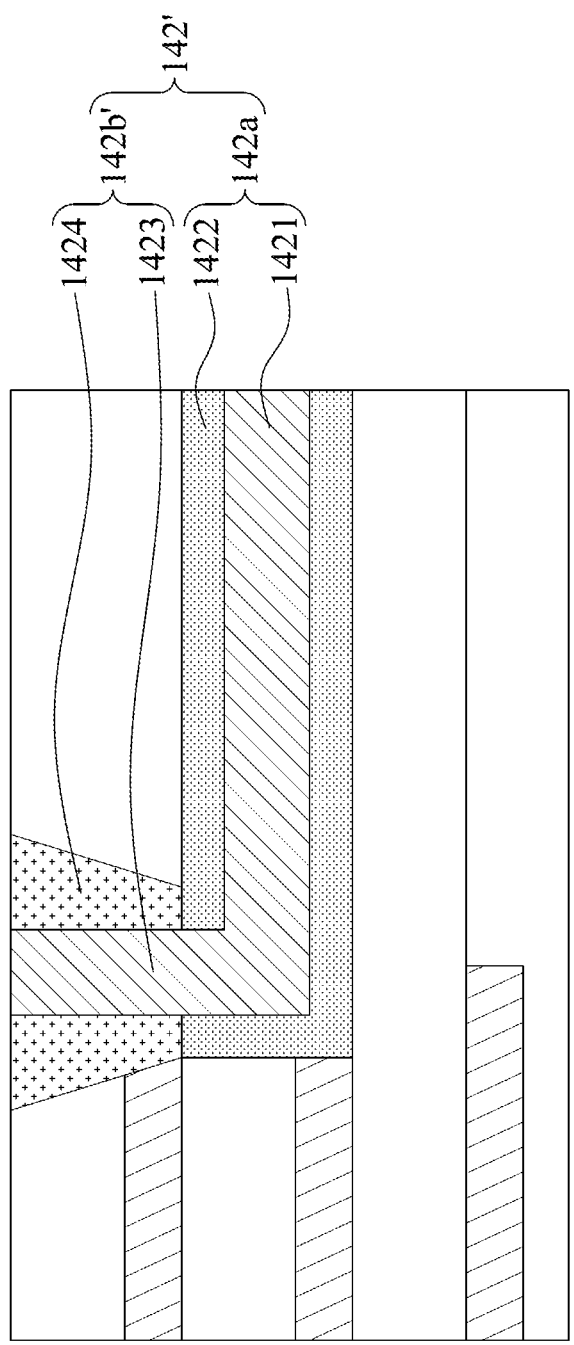

Referring to FIG. 7F, an optical signal transmission layer 1423 may be formed within the opening 110f to form a portion 142b'. The optical signal transmission layer 1423 may be in contact with the optical signal transmission layer 1421. As a result, an optical channel 142' is formed.

Figure 7G:
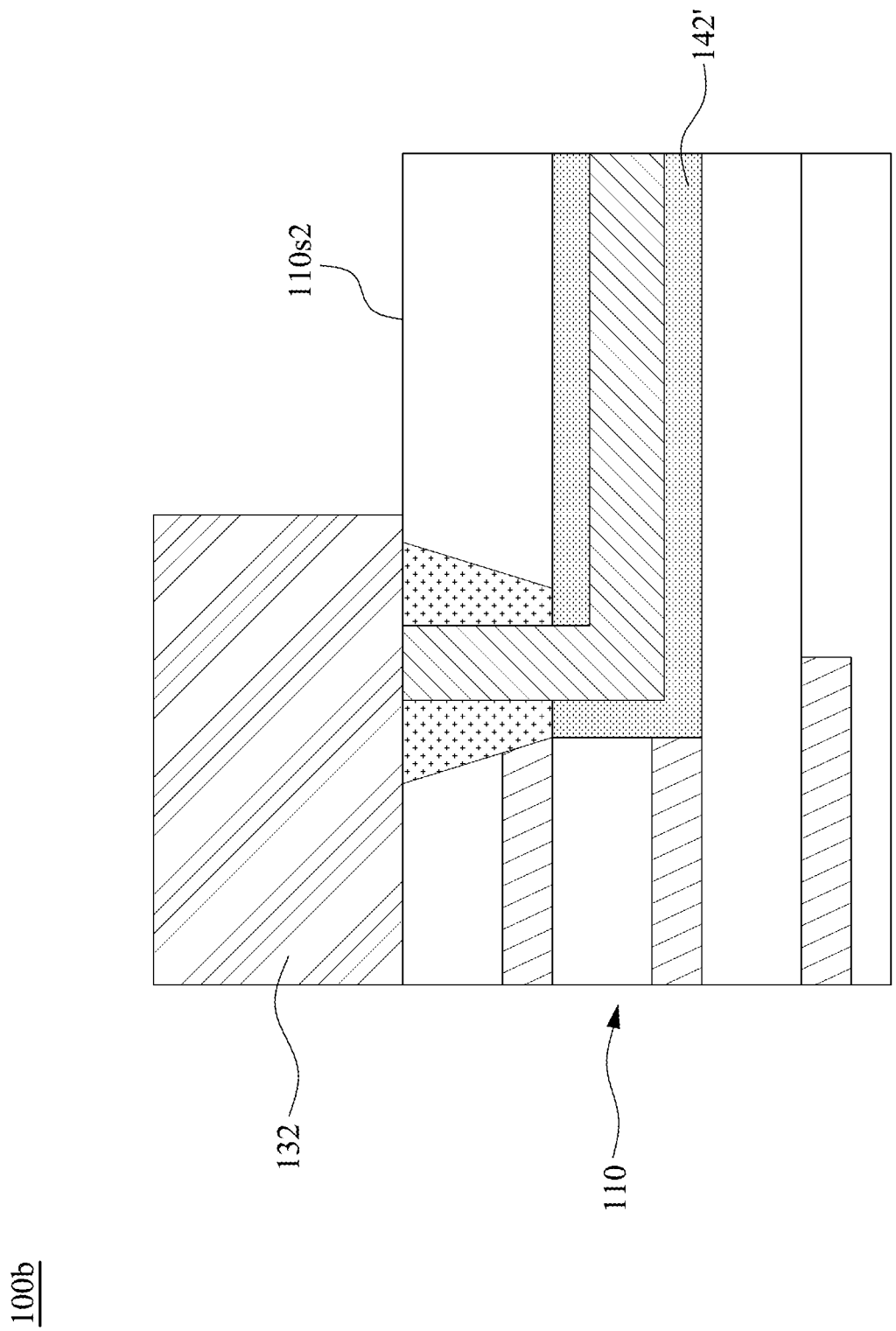

Referring to FIG. 7G, an electronic component 132 may be attached to a surface 110s2 of the carrier 110 so that the electronic component 132 may be in contact with the optical channel 142', thereby forming the electronic package structure 100b.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package structure, comprising:
   a first carrier;
   a first electronic component disposed on the first carrier;
   a first optical channel disposed within the first carrier and configured to provide optical communication between the first electronic component and a second electronic component,
   wherein the first carrier is configured to electrically connect the first electronic component, and the first optical channel has a first portion extending in a first direction and a second portion extending in a second direction different from the first direction.

2. The electronic package structure of claim 1, wherein the second direction is slanted with respect to the first direction.

3. The electronic package structure of claim 1, wherein the first optical channel comprises a continuous material extending from the first portion to the second portion.

4. The electronic package structure of claim 1, wherein the second portion is adjacent to the first electronic component and tapered along a direction far from the first electronic component.

5. The electronic package structure of claim 1, wherein the first optical channel comprises an optical signal transmission layer.

6. The electronic package structure of claim 5, wherein the optical signal transmission layer is in contact with the first carrier.

7. The electronic package structure of claim 1, wherein the first optical channel is a hollow tube.

8. An electronic package structure, comprising:
a first carrier;
a first electronic component disposed on the first carrier;
a first optical channel disposed within the first carrier and configured to provide optical communication between the first electronic component and a second electronic component, wherein the first carrier is configured to electrically connect the first electronic component; and
a second carrier, wherein the second electronic component is disposed on the second carrier, the first carrier has a first surface facing the second carrier, and the first optical channel is exposed from the first surface of the first carrier.

9. The electronic package structure of claim 8, further comprising:
a second optical channel disposed within the second carrier, wherein the second optical channel is aligned with the first optical channel.

10. An electronic package structure, comprising:
a first carrier;
a first electronic component disposed on the first carrier;
a first optical channel disposed within the first carrier and configured to provide optical communication between the first electronic component and a second electronic component,
wherein the first carrier is configured to electrically connect the first electronic component; and
a circuit board, wherein the first carrier is disposed on the circuit board, wherein the first carrier comprises a first redistribution structure, the circuit board comprises a second redistribution structure, and a line width of the first redistribution structure is less than that of the circuit board.

11. The electronic package structure of claim 9, wherein the first optical channel is spaced apart from the second optical channel by a gap.

12. The electronic package structure of claim 8 wherein the first carrier and the second carrier are disposed on and electrically connected to a circuit board and the circuit board is configured to provide power or ground to the first electronic component and the second electronic component.

13. The electronic package structure of claim 12, further comprising:
an encapsulant disposed on the circuit board and encapsulating the first electronic component and the second electronic component.

* * * * *